US012740129B2

(12) United States Patent
McMitchell et al.

(10) Patent No.: US 12,740,129 B2
(45) Date of Patent: Sep. 15, 2026

(54) CONDUCTIVE OXYGEN BARRIER FOR COMPLEX OXIDES

(71) Applicants: IMEC VZW, Leuven (BE); Katholieke Universiteit Leuven, Leuven (BE)

(72) Inventors: Sean McMitchell, Winksele (BE); Pratik Bagul, Leuven (BE); Xiaoyu Piao, Heverlee (BE)

(73) Assignees: Imec vzw, Leuven (BE); Katholieke Universiteit Leuven, Leuven (GB)

( * ) Notice: Subject to any disclaimer, the term of this patent is extended or adjusted under 35 U.S.C. 154(b) by 364 days.

(21) Appl. No.: 18/521,262

(22) Filed: Nov. 28, 2023

(65) Prior Publication Data

US 2024/0178299 A1 May 30, 2024

(30) Foreign Application Priority Data

Nov. 30, 2022 (EP) .................................... 22210459

(51) Int. Cl.
*H10D 64/66* (2025.01)
*H10W 20/00* (2026.01)

(52) U.S. Cl.
CPC ........ *H10D 64/667* (2025.01); *H10W 20/038* (2026.01)

(58) Field of Classification Search
CPC ... H10D 64/667; H10D 1/688; H10W 20/038; H10B 53/30
See application file for complete search history.

(56) References Cited

U.S. PATENT DOCUMENTS

2001/0024868 A1* 9/2001 Nagel .................... H10D 1/696 438/496
2002/0070404 A1* 6/2002 Bruchhaus ............. H10D 1/696 257/310
2004/0043578 A1 3/2004 Marsh
(Continued)

FOREIGN PATENT DOCUMENTS

WO 98/06131 A1 2/1998

OTHER PUBLICATIONS

Extended European Search Report and Search Opinion, Application No. EP 22210459.8, mailed May 25, 2023, 5 pages.
(Continued)

*Primary Examiner* — Steven H Loke
*Assistant Examiner* — Khatib A Rahman
(74) *Attorney, Agent, or Firm* — McDonnell Boehnen Hulbert & Berghoff LLP

(57) ABSTRACT

A conductive oxygen barrier layer, a stack comprising the conductive oxygen barrier layer, and method of forming the stack for a semiconductor device are provided. The method includes providing a semiconductor substrate, forming a conductive electrode layer on the semiconductor substrate, and forming a conductive oxygen barrier layer on the electrode layer, and then forming at least one complex oxide layer on the oxygen barrier layer. The forming of the oxygen barrier layer includes forming a silicon layer on the electrode layer and a platinum layer on the silicon layer. The forming of the at least one complex oxide layer comprises heating to a temperature in a range of 500-700° C. or higher, which results in the oxygen barrier layer comprising an alloy of platinum and silicon.

12 Claims, 4 Drawing Sheets

(56) References Cited

U.S. PATENT DOCUMENTS

| | | | | |
|---|---|---|---|---|
| 2005/0082587 | A1* | 4/2005 | Marsh | H10W 20/046 257/E21.171 |
| 2013/0264660 | A1 | 10/2013 | Fleischer et al. | |
| 2022/0352331 | A1* | 11/2022 | Yoon | H10D 64/513 |

OTHER PUBLICATIONS

Tao, Ye, Frank Gitmans, Zlatko Sitar, Harald Pierhöfer, Armin Kündig, Iris Gamboni, and Peter Günter. "Dielectric, pyroelectric and structural properties of LiTaO3 thin films grown on silicon by a modified molecular beam epitaxy." Ferroelectrics 201, No. 1 (1997): 245-253.

Gitmans, F., Z. Sitar, and P. Günter. "Structure and properties of LiTaO3 thin films grown by modified gas source molecular beam epitaxy." Microelectronic engineering 29, No. 1-4 (1995): 289-292.

Sinha, A. K., R. B. Marcus, T. T. Sheng, and S. E. Haszko. "Thermal stability of thin PtSi films on silicon substrates." Journal of Applied Physics 43, No. 9 (1972): 3637-3643.

Chen, Jiann-Ruey, Tian-Shyng Heh, and Ming-Pang Lin. "Epitaxial growth of platinum silicide layers on (111) Si substrates." Surface Science 162, No. 1-3 (1985): 657-662.

* cited by examiner

CONDUCTIVE OXYGEN BARRIER FOR COMPLEX OXIDES

CROSS-REFERENCE

This patent application claims priority based on European patent application case no. EP 22210459.8, filed on Nov. 30, 2022, which is incorporated by reference in its entirety.

FIELD OF THE PRESENT DISCLOSURE

The present disclosure relates to oxygen barriers that can be used for fabricating semiconductor devices. The present disclosure particularly proposes a conductive oxygen barrier layer in a stack for a semiconductor device, wherein the stack also includes at least one complex oxide. The present disclosure provides the stack, a method for forming the stack, and a semiconductor device including the stack.

BACKGROUND OF THE PRESENT DISCLOSURE

Functional complex oxides may be incorporated into semiconductor stacks, for instance, into silicon-based architectures. Typically, for achieving a crystallization of the complex oxide layers, a high-temperature complex oxide growth under oxidizing conditions is required. However, the high oxygen content and the mobility in these materials at the elevated temperatures may lead to an undesired oxidization of underlying layers, in particular, electrode layers already formed in the stack. These oxide layers may then act as dielectric layers to the detriment of the performance of the semiconductor device comprising the stack. Thus, an oxygen barrier layer is needed to prevent the formation of such oxide layers that can cause voltage drops across the functional complex oxide layer and can increase the operational voltages.

As an example, platinum may be used to form an oxygen barrier layer between the complex oxide layers and underlying layers, and works reasonably well in an intermediate temperature range of temperatures ranging between 300-500° C. However, at higher temperatures, oxygen can migrate down grain boundaries to oxidize the underlying layers. Several other options exist for the intermediate temperature range, but there are very few options for oxygen barrier layers suitable for growth at higher temperatures, i.e., temperatures above 500° C. or even higher as required for the growth of high-quality complex oxides.

SUMMARY OF THE PRESENT DISCLOSURE

In view of the above, an objective of the present disclosure is to provide an oxygen barrier layer, which prevents the oxidization of underlying layers in a stack in which also at least one complex oxide layer is formed. Another objective is that the oxygen barrier layer is grain boundary free, and is suitable to truly block all oxygen migration up to at least a temperature of 750° C. Further objectives are that the oxygen barrier layer provides good adhesion for a complex oxide layer, and that it can be made conductive, in order to achieve a good electrical contact to one or more complex oxide layers.

These and other objectives are achieved by the solutions of this disclosure as provided in the independent claims. Beneficial implementations are defined in the dependent claims.

A first aspect of the present disclosure provides a method of forming a stack for a semiconductor device, the method comprising: providing a semiconductor substrate; forming a conductive electrode layer on the semiconductor substrate; forming a conductive oxygen barrier layer on the electrode layer; and forming at least one complex oxide layer on the oxygen barrier layer; wherein forming the oxygen barrier layer includes forming a silicon layer on the electrode layer and forming a platinum layer on the silicon layer; and wherein forming the at least one complex oxide layer comprises heating to a temperature in a range of 500-700° C. or higher.

In particular, the forming of the complex oxide layers, e.g. by deposition, may be performed at a temperature of 550° C., but may even be performed at higher temperatures like 700° C. or more.

The growth of the oxygen barrier layer including the silicon layer and the platinum layer leads to the formation of an alloy of platinum and silicon, when the at least one complex oxide layer is formed at the high temperatures of 500° C. or more. This silicon-platinum-alloy layer is effective in blocking all oxygen migration up to at least a temperature of 750° C., which may be explained by the stack having only a small number of grain boundaries.

In one embodiment of the method, a thickness of the silicon layer is in a range of 4-6 nm or in a range of 9-11 nm; and a thickness of the platinum layer is in a range of 9-11 nm.

For instance, the silicon layer may have a thickness of 5 nm, or may have a thickness of 10 nm. For example, if the thickness of the silicon layer is 5 nm, the thickness of the platinum layer may be 10 nm. For instance, in a stack that includes at least one ferroelectric complex oxide, this may result in a lower coercive electric field. As another example, if the thickness of the silicon layers is 10 nm, the thickness of the platinum layer may be 10 nm. For example, in a stack that includes at least one ferroelectric complex oxide, this may result in a relatively higher coercive electric field and also in a relatively higher remnant polarization than for the former example. Overall, in terms of improvement of ferroelectricity the complex oxide, e.g., if the complex oxide includes a barium titanate layer, the latter example maybe more ideal.

In an embodiment of the method, the at least one complex oxide layer is formed under oxidizing conditions.

This may lead to a high quality of the one or more complex oxide layers.

In an embodiment of the method, a thickness of the conductive layer is in a range of 8-12 nm, and/or a thickness of the at least one complex oxide layer is in a range of 1-10 nm or more.

In an embodiment of the method, the oxygen barrier layer is used as a template for forming the at least one complex oxide layer and/or for electrically contacting the at least one complex oxide layer to the electrode layer.

In an implementation of the method, the complex oxide layer is conductive.

The oxygen barrier layer may thus provide good adhesion for the at least one complex oxide layer. If the at least one complex oxide layer is conductive, it may be electrically contacted by the conductive barrier layer to the electrode layer. Notably, the at least one complex oxide layer does not have to be conductive. Since the oxygen barrier layer is conductive, it may act as an electrode itself.

A second aspect of this disclosure provides a stack for a semiconductor device, the stack comprising: a semiconductor substrate; a conductive electrode layer arranged on the semiconductor substrate; a conductive oxygen barrier layer arranged on the electrode layer; and at least one complex oxide layer arranged on the oxygen barrier layer; wherein the oxygen barrier layer comprises an alloy of platinum and silicon.

In an embodiment of the stack, the oxygen barrier layer is crystalline.

In an embodiment of the stack, a platinum content of the oxygen barrier layer is in a range of 60-75%, and a silicon content of the oxygen barrier layer is in a range of 25-40%.

For instance, $Pt_2Si$ or $Pt_3Si$ or a mix of both may be formed.

In an embodiment of the stack, a thickness of the oxygen barrier layer is in a range of 10-20 nm.

This range may result from a combination of a 10 nm silicon layer and a 10 nm platinum layer, which are formed in the method of the first aspect.

In an embodiment of the stack, the at least one complex oxide layer comprises a perovskite oxide layer.

As other examples, the at least one complex oxide layer may comprise a tetragonal tungsten bronze layer, or also one or more layers of brownmillerite, corrundum, spinel, and/or mellilite.

In an embodiment of the stack, the at least one complex oxide layer comprises at least one of a barium titanate layer and a lanthanum nickelate layer.

The barium titanate layer could be combined with the lanthanum nickelate layer, but may also be combined with any perovskite or other complex oxide layer.

In an embodiment of the stack, the electrode layer comprises a titanium nitride layer.

That is, the stack may comprise a layer sequence of a titanium nitride layer, a platinum-silicon-alloy layer, and a complex oxide layer.

In an embodiment of the stack, the semiconductor substrate comprises a silicon or silicon-based substrate surface layer.

A third aspect of the present disclosure provides a semiconductor device comprising one or more stacks according to the second aspect or any embodiment thereof.

The semiconductor device of the third aspect can thus enjoy the benefits of the stack of the second aspect or its implementations. The semiconductor device may comprise a capacitor stack and/or a ferroelectric stack. For instance, the semiconductor device may be a ferroelectric field effect transistor device.

BRIEF DESCRIPTION OF THE DRAWINGS

The above described aspects and embodiments are explained in the following description of embodiments of the present disclosure with respect to the following drawings.

DETAILED DESCRIPTION OF THE PRESENT DISCLOSURE

Figure 1:
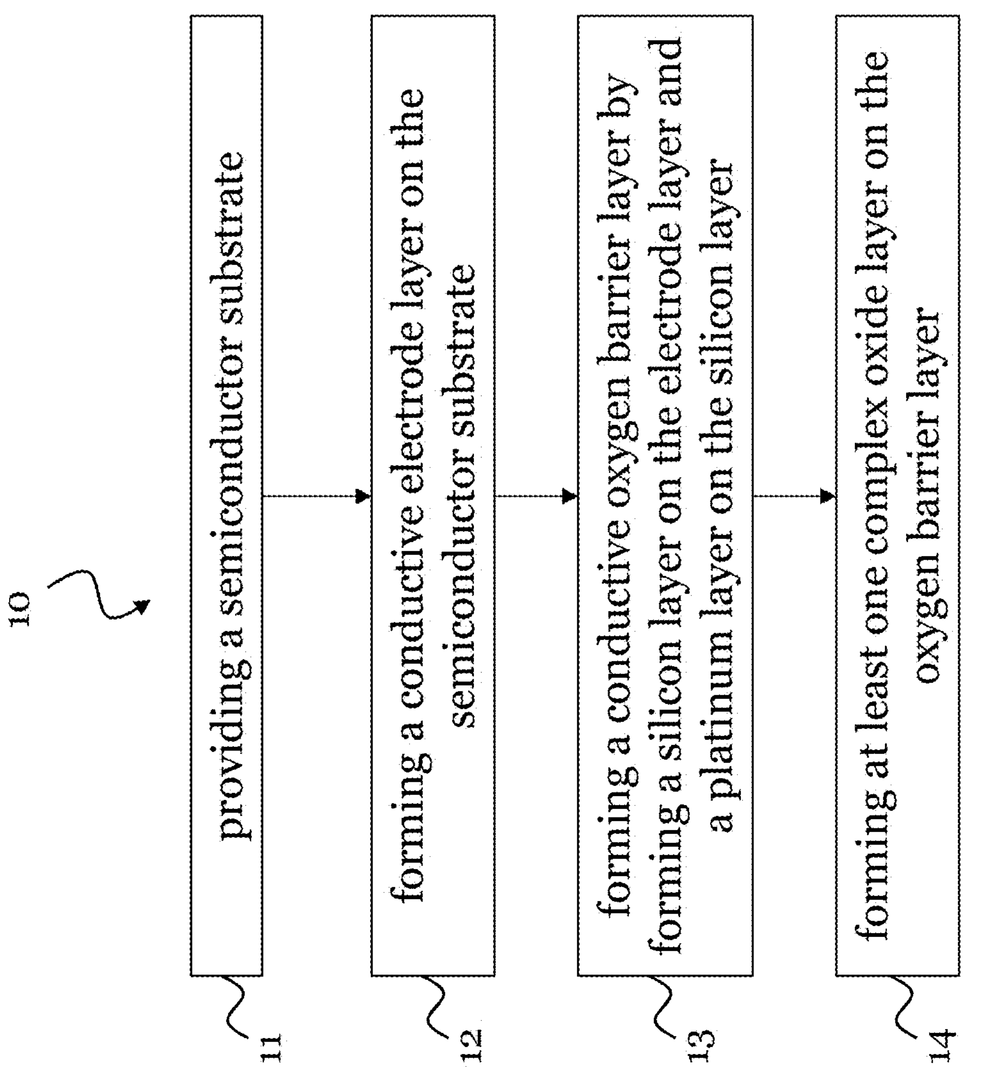
FIG. 1 shows a flow-diagram of a method, for fabricating a stack for a semiconductor device, according to an embodiment of the present disclosure.
Figure 2:
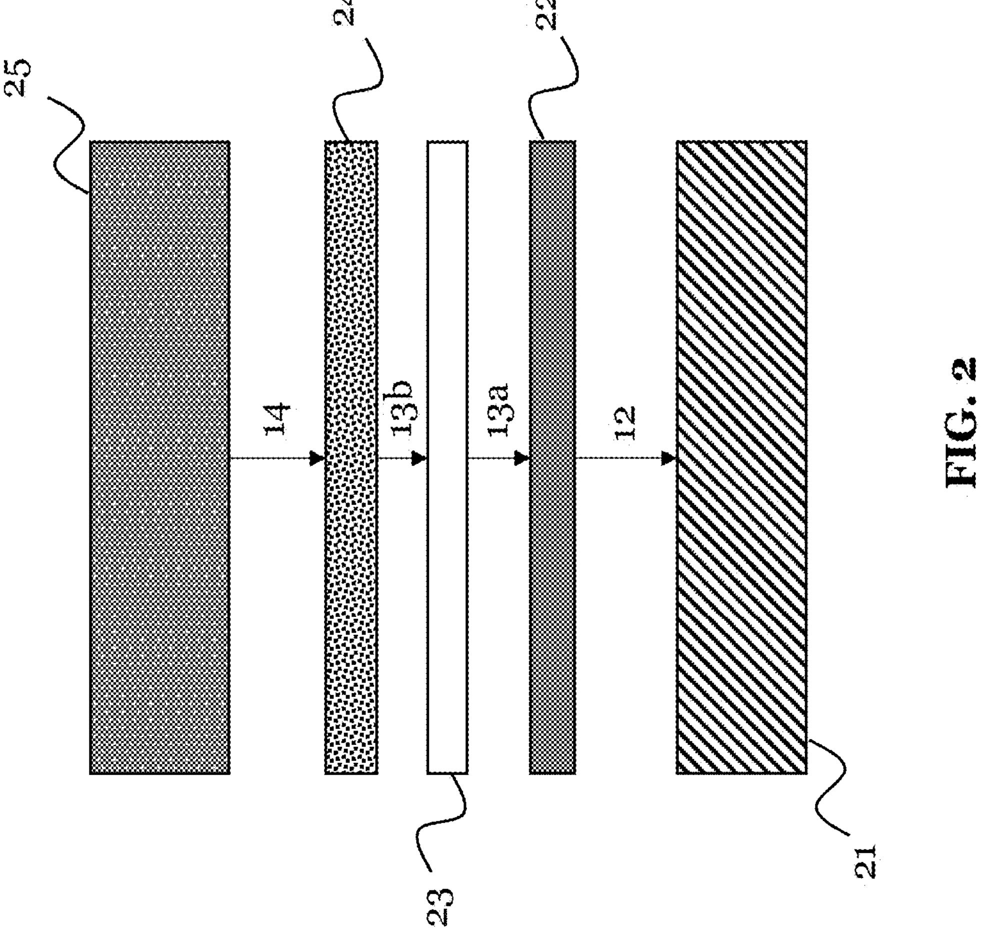
FIG. 2 illustrates the method of FIG. 1, in particular, the layers formed in the respective method steps.
Figure 3:
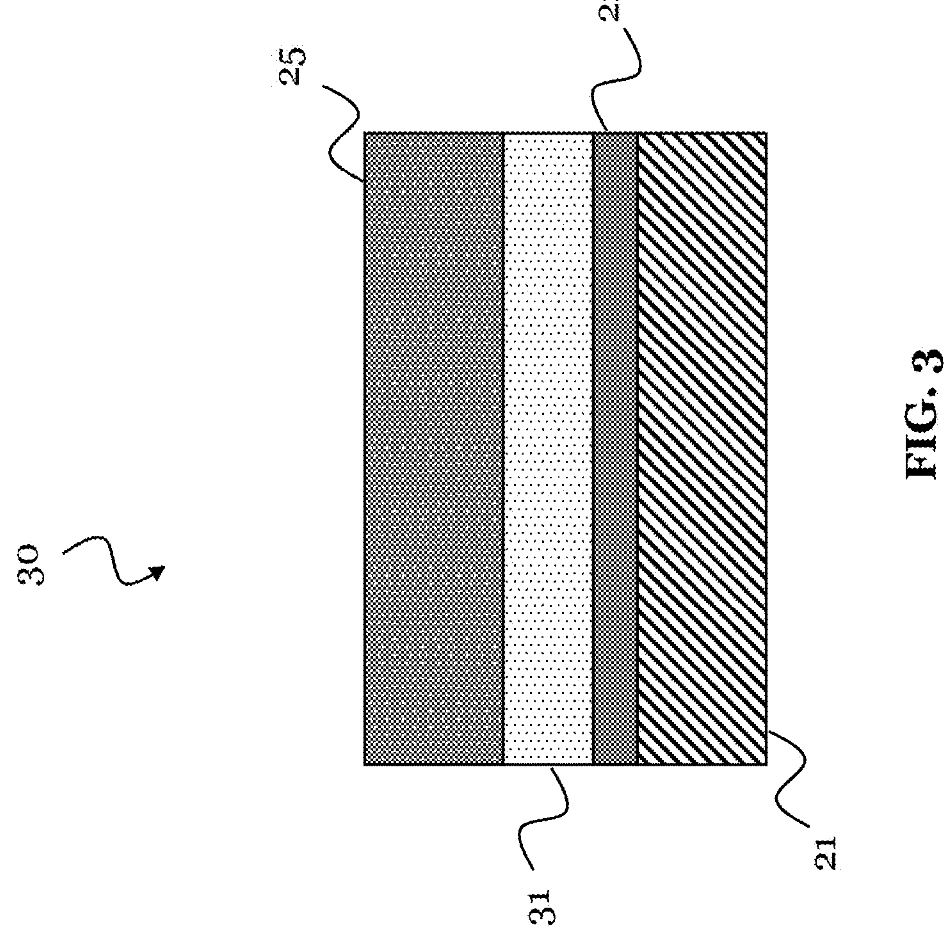
FIG. 3 shows a stack according to an embodiment of the present disclosure, wherein the stack may be fabricated according to the method of FIG. 1 and FIG. 2.

FIG. 1 and FIG. 2 show a method 10 of forming a stack 30 (e.g., as it is shown in FIG. 3). The stack 30 can be used in a semiconductor device. FIG. 1 shows a flow-diagram of the steps of the method 10, while FIG. 2 shows the layers of the stack 30, which are formed one on top of the other in the respective method steps (as indicated by the he arrows).

The method 10 comprises a step 11 of providing a semiconductor substrate 21. The semiconductor substrate 21 may be or may comprise a silicon or silicon-based substrate surface layer.

The method 10 further comprises a step 12 of forming a conductive electrode layer 22 on the semiconductor substrate 21. The electrode layer 22 may be or may comprise a titanium nitride layer.

The method 10 further comprises a step 13 of forming a conductive oxygen barrier layer on the electrode layer 22. As shown in FIG. 2, this step 13 includes a sub-step **13*a* of forming a silicon layer 23 on the electrode layer 22, and a sub-step 13*b* of forming a platinum layer 24 on the silicon layer 23**.

The method 10 further comprises a step 14 of forming at least one complex oxide layer 25 on the oxygen barrier layer, in particular, on the platinum layer 24. The forming of the at least one complex oxide layer 25 comprises heating to a temperature in a range of 500-700° C. or even higher, which also heats the previously formed layers 22, 23, 24 of the stack 30 to that temperature. Moreover, at least typically, the at least one complex oxide layer 25 is formed under highly oxidizing conditions.

As can be gathered from FIG. 2, the conductive oxygen barrier layer may thus be used as a template for forming the at least one complex oxide layer 25, and could also be used for electrically contacting the at least one complex oxide layer 25 to the electrode layer 22, if the at least one complex oxide layer 25 is conductive.

FIG. 3 shows a stack 30 according to an embodiment of the disclosure. The stack 30 may be the result of the method 10 performed in FIG. 1 and FIG. 2.

Accordingly, the stack 30 comprises the semiconductor substrate 21, the conductive electrode layer 22 arranged on the semiconductor substrate 21, the conductive oxygen barrier layer 31 arranged on the electrode layer 22, and the at least one complex oxide layer 25 arranged on the oxygen barrier layer 31.

The oxygen barrier layer 31 comprises an alloy of platinum and silicon, wherein this alloy may be the result of forming the silicon layer 23 and the platinum layer 24 in the method 10, and of the subsequent high temperature of 500° C. or more occurring during the forming of the at least one complex oxide layer 25 in the method 10. The oxygen barrier layer 31 may be formed such that it is crystalline.

Figure 4:
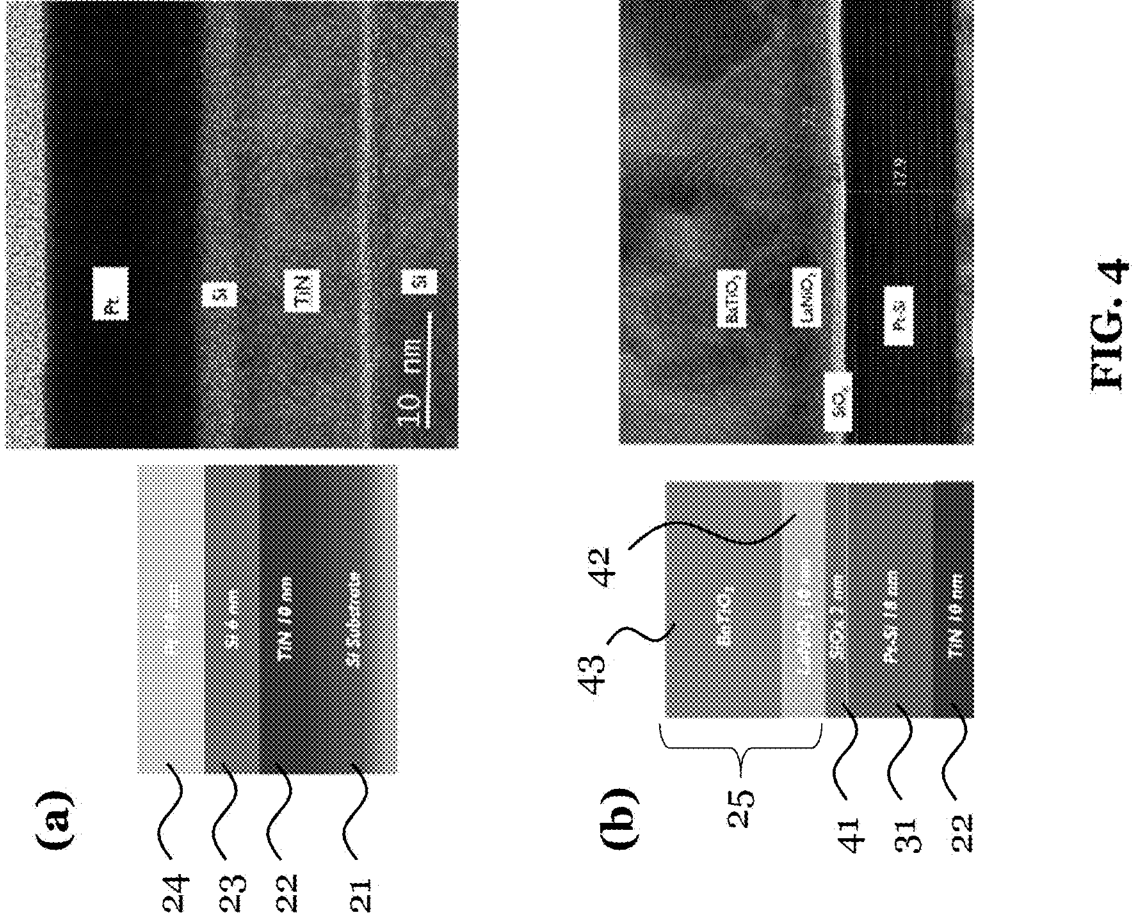
FIG. 4 shows part (a) a stack grown with a method according to an embodiment of the present disclosure, but before forming the at least one complex oxide layer, and shows part (b) the stack after the at least one complex oxide layer is formed.

FIG. 4, part (a), shows an exemplary stack 30 as fabricated according to the method 10, but before the step 14 of forming the at least one complex oxide layer 25. FIG. 4, part (b), shows the same exemplary stack 30 after the step 14 of forming the at least one complex oxide layer 25. FIG. 4, parts (a) and (b) both show a schematic of the respective stack 30 and a transmission electron microscopy image of the respective stack 30.

As an example, FIG. 4, part (a), shows that a 6 nm silicon layer 23 followed by a 10 nm platinum layer 24 may be deposited at room temperature on a titanium nitride electrode layer 22, which is arranged on a silicon substrate 21. Generally, the thickness of the silicon layer 23 may be in a range of 4-6 nm, or may be in a range of 9-11 nm. The thickness of the platinum layer 24 may generally be in a range of 9-11 nm. The thickness of the titanium nitride electrode layer 22 is about 10 nm in this example.

The deposition of the silicon layer 23 and the platinum layer 24 creates a structure that, under the high temperatures of 500° C. or more occurring during the subsequent growth of the at least one complex oxide 25 (see FIG. 4, part (b)), forms an alloy of platinum and silicon (Pt—Si). This alloy may generally have a platinum content in a range of 60-75%, and a silicon content in a range of 25-40%. In the example of FIG. 4, parts (a) and (b), this alloy may have a silicon content of about 37.5% and a platinum content of about 62.5%. A thickness of the oxygen barrier layer 31 is notably about 18 nm in this example.

The Pt—Si alloy prevents the migration of oxygen to the underlying layers, i.e., particularly to the electrode layer 22. Thus, it is beneficial for the performance of the stack 30 and the semiconductor device including the stack 30. The absence of observed grain boundaries in the Pt—Si alloy of the oxygen barrier layer 31 seems to aid in the inhibition of oxygen migration. The Pt—Si alloy may be crystalline, and may show strong X-ray diffraction peaks.

The at least one complex oxide layer 25 may generally comprises a perovskite oxide layer, or at least one of a barium titanate layer 43 and a lanthanum nickelate layer 42. In the example of FIG. 4, parts (a) and (b), the complex oxide layer 25 includes the lanthanum nickelate layer 43 on the oxygen barrier layer 31, and the barium titanate layer 42 on the lanthanum nickelate layer 42. Generally, a thickness of the at least one complex oxide layer can be is in a range of 1-10 nm or more. In the example of FIG. 4, parts (a) and (b), the thickness of the lanthanum nickelate layer 42 is about 10 nm, and the thickness of the barium titanate layer 42 is at least larger than 10 nm.

Notably, a thin oxide layer 41 (here silicon oxide) may form at the interface of the oxygen barrier layer 31 and the at least one complex oxide layer 25. Note that this oxide layer 41 is an artifact of the type of complex oxide layer used in this example, and may be eliminated with the used of other complex oxides.

In summary, the present disclosure provides a solution for CMOS integration of complex oxide materials. This has been a hurdle up to date, due to the high growth temperatures and strong oxidizing conditions, which are needed for growing complex oxide layers, but which result in the oxidation of underlying layers in the stack, and may lead to the formation of lower-k oxides that can increase operational voltages. This disclosure proposes the use of an effective oxygen barrier layer comprising a Pt—Si alloy to prevent the oxidization of the layers of the stack underlying the one or more complex oxide layers. With this oxygen barrier layer in the stack, an electrical contact as well as a template for the one or more complex oxide layers can be achieved as well.

What is claimed:

1. A method of forming a stack for a semiconductor device, the method comprising:
- providing a semiconductor substrate;
- forming a conductive electrode layer on the semiconductor substrate;
- forming a conductive oxygen barrier layer on the electrode layer; and
- forming at least one complex oxide layer on the oxygen barrier layer;
- wherein forming the oxygen barrier layer includes forming a silicon layer on the electrode layer and forming a platinum layer on the silicon layer.

2. The method according to claim 1, wherein:
- a thickness of the silicon layer is in a range of 4-6 nm or 9-11 nm; and
- a thickness of the platinum layer is in a range of 9-11 nm.

3. The method according to claim 1, wherein the at least one complex oxide layer is formed under oxidizing conditions.

4. The method according to claim 2, wherein the at least one complex oxide layer is formed under oxidizing conditions.

5. The method according to claim 1, wherein a thickness of the conductive electrode layer is in a range of 8-12 nm, and/or a thickness of the at least one complex oxide layer is in a range of 1-10 nm or more.

6. The method according to claim 2, wherein a thickness of the conductive electrode layer is in a range of 8-12 nm, and/or a thickness of the at least one complex oxide layer is in a range of 1-10 nm or more.

7. The method according to claim 3, wherein a thickness of the conductive electrode layer is in a range of 8-12 nm, and/or a thickness of the at least one complex oxide layer is in a range of 1-10 nm or more.

8. The method according to claim 1, wherein the oxygen barrier layer is used as a template for forming the at least one complex oxide layer and/or for electrically contacting the at least one complex oxide layer to the electrode layer.

9. The method according to claim 2, wherein the oxygen barrier layer is used as a template for forming the at least one complex oxide layer and/or for electrically contacting the at least one complex oxide layer to the electrode layer.

10. The method according to claim 3, wherein the oxygen barrier layer is used as a template for forming the at least one complex oxide layer and/or for electrically contacting the at least one complex oxide layer to the electrode layer.

11. The method according to claim 1, wherein the at least one complex oxide layer is conductive.

12. The method of claim 1, wherein forming the at least one complex oxide layer comprises heating to a temperature in a range of 500-700° C. or higher.

* * * * *